(12) United States Patent
Sugimoto et al.

(10) Patent No.: US 8,110,870 B2
(45) Date of Patent: Feb. 7, 2012

(54) SEMICONDUCTOR DEVICE

(75) Inventors: Masahiro Sugimoto, Toyota (JP);
Tsutomu Uesugi, Seto (JP); Masakazu Kanechika, Aichi-ken (JP); Tetsu Kachi, Nisshin (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 388 days.

(21) Appl. No.: 12/502,251

(22) Filed: Jul. 14, 2009

(65) Prior Publication Data

US 2010/0013006 A1 Jan. 21, 2010

(30) Foreign Application Priority Data

Jul. 15, 2008 (JP) ................................. 2008-183496

(51) Int. Cl.
*H01L 29/66* (2006.01)
(52) U.S. Cl. ............... 257/329; 257/335; 257/E29.256; 257/E29.262
(58) Field of Classification Search .............. 257/329, 257/335, E29.256, E29.262
See application file for complete search history.

(56) References Cited

U.S. PATENT DOCUMENTS

| 4,202,003 A | 5/1980 | Darley et al. |
| 5,324,969 A | 6/1994 | Murai et al. |
| 5,396,087 A * | 3/1995 | Baliga ........................ 257/139 |
| 5,543,637 A | 8/1996 | Baliga |
| 6,169,299 B1 * | 1/2001 | Kawaji et al. ................ 257/137 |
| 6,396,085 B1 | 5/2002 | Yoshida |
| 7,211,839 B2 | 5/2007 | Kachi et al. |

FOREIGN PATENT DOCUMENTS

JP 2004-260140 9/2004

OTHER PUBLICATIONS

Extended European Search Report dated Nov. 16, 2009 for EP Appl. No. 09165579.5.
Hirayama, M., "GaAs IC Technology SAINT," Review of the Electrical Communications Laboratories, vol. 36, No. 6, 1988, pp. 503-508.

* cited by examiner

*Primary Examiner* — Lex Malsawma
(74) *Attorney, Agent, or Firm* — Finnegan, Henderson, Farabow, Garrett & Dunner, LLP (57) ABSTRACT

A semiconductor device has a semiconductor substrate having a surface layer and a p-type semiconductor region, wherein the surface layer includes a contact region, a channel region and a drift region, the channel region is adjacent to and in contact with the contact region, the drift region is adjacent to and in contact with the channel region and includes n-type impurities at least in part, and the p-type semiconductor region is in contact with the drift region and at least a portion of a rear surface of the channel region, a main electrode disposed on the surface layer and electrically connected to the contact region, a gate electrode disposed on the surface layer and extending from above a portion of the contact region to above at least a portion of the drift region via above the channel region, and an insulating layer covering at least the portion of the contact region and not covering at least the portion of the drift region. The gate electrode and the contact region are insulated by the insulating layer, and the gate electrode and the drift region are in direct contact to form a Schottky junction.

13 Claims, 6 Drawing Sheets

SEMICONDUCTOR DEVICE

CROSS REFERENCE TO RELATED APPLICATION

The present application claims priority to Japanese Patent Application No. 2008-183496 filed on Jul. 15, 2008, the contents of which are hereby incorporated by reference into the present specification.

BACKGROUND OF THE INVENTION

1. Field of the Invention

The present invention relates to a semiconductor device having a gate structure for switching.

2. Description of the Related Art

Figure 10:
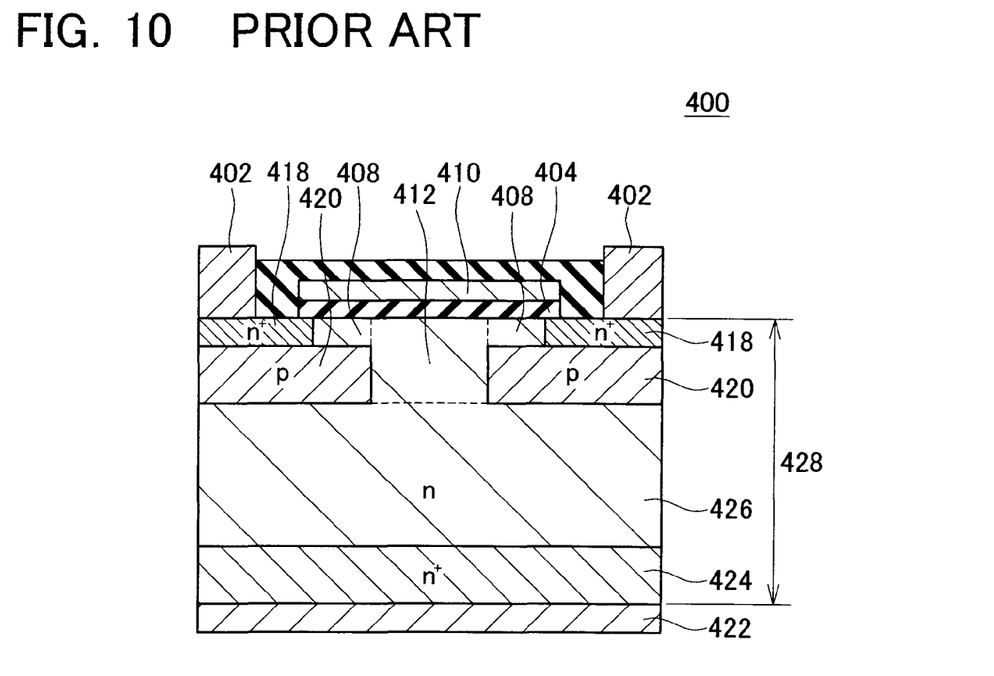
FIG. 10 shows a longitudinal cross-sectional view of a conventional semiconductor device.

FIG. 10 shows a cross-sectional view of essential parts of a conventional semiconductor device 400. The semiconductor device 400 is set forth in Japanese Patent Application Publication No. 2004-260140. The semiconductor device 400 is a vertical semiconductor device. In the semiconductor device 400, a pair of source electrodes 402 is disposed on a surface of a semiconductor substrate 428, and a drain electrode 422 is disposed on a rear surface of the semiconductor substrate 428. A gate electrode 410 is disposed between the pair of source electrodes 402. Actually, the gate electrode 410 is located between the drain electrode 422 and each of the source electrode 402. The gate electrode 410 switches the state of the current between the drain electrode 422 and the pair of source electrodes 402 between a conducting state and a non-conducting state.

A pair of source regions 418 is disposed on a part of a surface layer of the semiconductor substrate 428, and is electrically connected to the pair of source electrodes 402. A pair of channel regions 408 is disposed on a part of the surface layer of the semiconductor substrate 428, and is adjacent to the pair of source regions 418. An aperture region 412 is disposed on a part of the surface layer of the semiconductor substrate 428, and is adjacent to the pair of channel regions 408. The aperture region 412 extends internally from the surface of the semiconductor substrate 428, passes through an embedded region 420, and makes contact with a drift region 426. The aperture region 412 can also be called a region between the pair of embedded regions 420. Moreover, as will be described below, the aperture region 412 is a passage allowing electrons injected from the pair of source regions 418 to flow in a vertical direction. For this reason, the aperture region 412 can also be called a part of the drift region 426. The aperture region 412 can also be referred to as a protruding portion of the drift region 426. The pair of p-type embedded regions 420 makes contact with a rear surface of the pair of channel regions 408. The gate electrode 410 is disposed on the surface of the semiconductor substrate 428 with a gate insulating layer 404 in between. The gate electrode 410 opposes (faces) the pair of channel regions 408, the aperture region 412, and the pair of source region 418 via the gate insulating layer 404. The semiconductor device 400 further comprises an n$^+$-type drain region 424 at a rear surface layer of the semiconductor substrate 428. The drain region 424 is electrically connected to the drain electrode 422.

In the semiconductor device 400, when positive voltage is not being applied to the gate electrode 410, a depletion layer extends from the p-type embedded region 420 to the channel region 408. The channel region 408 has a thickness that is easily depleted when application of positive voltage to the gate electrode 410 is stopped. When the channel region 408 has been depleted, the source region 418 and the aperture region 412 are electrically isolated, and the semiconductor device 400 is turned off. When positive voltage is applied to the gate electrode 410, the depletion layer that was formed in the channel region 408 contracts. Electrons thereby move from the source region 418 across the channel region 408 to the aperture region 412, and the semiconductor device 400 is turned on.

BRIEF SUMMARY OF THE INVENTION

Theoretically, the gate electrode 410 merely need to oppose only the channel region 408 in order to switch the semiconductor device 400 on and off. However, taking the manufacturing tolerance of semiconductor devices into consideration, it is desirable to have the gate electrode 410 oppose the source region 418 and the aperture region 412. That is, it is desirable to cause the gate electrode 410 to overlap not only with the channel region 408, but also with the source region 418 and the aperture region 412. Even if the position at which the gate electrode 410 is formed were to become somewhat misaligned, the gate electrode 410 can thereby be made to reliably oppose a whole area of the channel region 408. As a result, an increase in channel resistance can be prevented.

When the semiconductor device 400 is switched from on to off, the depletion layer extends from the p-type embedded region 420 to not only the channel region 408 but also to the aperture region 412. If the aperture region 412 is completely depleted, the semiconductor device 400 is capable of obtaining a high withstand voltage. However, in the case where the aperture region 412 is not completely depleted, for example, during the transition period for the depletion layer to extend from the p-type embedded region 420 to the aperture region 412, a high electric field may be applied to the gate insulating layer 404. In this case, the gate insulating layer 404 undergoes insulation breakdown. In order to prevent insulation breakdown of the gate insulating layer 404, the horizontal width of the aperture region 412 has to be made narrower. However, if the horizontal width of the aperture region 412 is made narrower, the problem occurs that drift resistance of the aperture region 412 increases.

The present specification aims to present a technique for reducing on-resistance of a semiconductor device while maintaining high withstand voltage in the semiconductor device having a gate structure for switching.

The semiconductor device disclosed in the present specification is characterized in that the gate structure contains a Schottky gate part and an insulating gate part. The gate structure of a conventional semiconductor device consists either of the Schottky gate part or the insulating gate part. A gate electrode part that simultaneously comprises both the Schottky gate part and the insulating gate part is a novel feature that is not present in the conventional semiconductor device. The "insulating gate part" referred to in the present specification refers to a portion where the gate electrode opposes the semiconductor substrate via the insulating layer. Further, the "Schottky gate part" refers to a portion where the gate electrode forms a Schottky junction with the semiconductor substrate. The insulating gate part is useful in allowing insulation to be ensured between the gate electrode and a contact region such as a source region. The Schottky gate part is useful in efficiently extending the depletion layer to the drift region. Further, since the Schottky gate part is not provided with a gate insulating layer, it is useful in developing endurance against occurrence of insulation breakdown even if a high electric field is applied to the gate electrode part. By combining these characteristics, a semiconductor device that has high withstand voltage and low on-resistance that could not be obtained by the conventional technique can be realized.

A semiconductor device disclosed in the present specification has a semiconductor substrate, a main electrode such as a source electrode or a drain electrode, and a gate structure. The semiconductor substrate has a p-type semiconductor region and a surface layer part. A contact region, a channel region, and a drift region are included in the surface layer part. The channel region is adjacent to and in contact with the contact region. The drift region is adjacent to and in contact with the channel region and includes n-type impurities at least in part. The p-type semiconductor region is in contact with the drift region and at least a portion of a rear surface of the channel region. The main electrode is disposed on the surface layer and electrically connected to the contact region. A gate electrode is disposed on the surface layer and extending from above a portion of the contact region to above at least a portion of the drift region via above the channel region. An insulating layer is covering at least the portion of the contact region and not covering at least the portion of the drift region. The gate electrode and the contact region are insulated by the insulating layer, and the gate electrode and the drift region are in direct contact to form a Schottky junction. As a result, a depletion layer extends within the drift region from the p-type semiconductor region. The main electrode is electrically connected to the contact region of the surface layer part of the semiconductor substrate. The gate configuration is disposed on the channel region, a portion of the contact region, and a portion of the drift region. The gate configuration has a Schottky gate part, and an insulating gate part insulated from the semiconductor substrate by an insulating layer. The insulating gate part opposes a surface of the contact region via a gate insulating layer. The Schottky gate part makes direct contact with the surface of the drift region. A Schottky junction may be present between the channel region and the gate electrode, or an insulating layer may be interposed between the two.

The semiconductor device of the present teachings comprising the semiconductor substrate, the main electrode, the gate electrode and the insulating layer, may also be described that the gate electrode comprises an insulating gate electrode part that opposes the portion of the contact region via the insulating layer and a Schottky electrode part that makes direct contact with the drift region.

The present teachings may also be practiced in a method of manufacturing the aforestated semiconductor device. The method may comprise preparing a semiconductor substrate having a surface layer and a p-type semiconductor region, wherein the surface layer includes a contact region, a channel region adjacent to and in contact with the contact region, and a drift region adjacent to and in contact with the channel region and including n-type impurities at least in part, and the p-type semiconductor region is in contact with the drift region and at least a portion of a rear surface of the channel region. The method further includes forming an insulating layer on the surface of the semiconductor substrate, the insulating layer comprising an opening from which at least a portion of the drift region exposes and covering the entirety of the contact region. The method also includes forming a gate electrode on the insulating layer and the opening, the gate electrode extending from above at least a portion of the contact region and to above at least the portion of the drift region via above the channel region and being in contact with the portion of the drift region, and forming a main electrode on the surface layer so that the main electrode makes contact with the contact region.

These aspects and features may be utilized singularly or, in combination, in order to make improved semiconductor device. In addition, other objects, features and advantages of the present teachings will be readily understood after reading the following detailed description together with the accompanying drawings and claims. Of course, the additional features and aspects disclosed herein also may be utilized singularly or, in combination with the above-described aspects and features.

DETAILED DESCRIPTION OF THE EMBODIMENT

Some of the features of the embodiments will be described below.

A semiconductor device herein disclosed has a semiconductor substrate, a main electrode, and a gate structure. The semiconductor substrate has a p-type semiconductor region and a surface layer part. A contact region, a channel region, and a drift region are included in the surface layer part. The channel region is adjacent to the contact region, and may have a first thickness. Moreover, the following may be adopted in the channel region: a configuration in which an inversion layer is formed, or a configuration in which a stacked layer for forming a two-dimensional electron gas layer, or the like is formed. The p-type semiconductor region makes contact with at least a portion of a rear surface of the channel region, and includes p-type impurities. The drift region makes contact with the channel region and the p-type semiconductor region, and has a second thickness that is thicker than the first thickness. The drift region has, in at least a portion of the drift region, a portion that includes n-type impurities.

The above semiconductor device is characterized in that the insulating gate part is disposed opposing the surface of the contact region, and the Schottky gate part is disposed opposing at least a portion of the surface of the drift region. By disposing the insulating gate part opposing the surface of the contact region, the gate insulating layer electrically isolates the contact region and the gate electrode. As a result, the contact region and the gate structure can be overlapped. The gate structure can thereby reliably be made to oppose the entire area of the channel region even if there is some misalignment in the position where the gate structure is formed, and an increase in channel resistance can be suppressed. By disposing the Schottky gate part opposing at least a portion of the surface of the drift region, the depletion layer can efficiently be made to extend from the p-type semiconductor region toward the n-type drift region when the semiconductor device has been turned off. Further, since the Schottky gate part is disposed on the surface of the drift region, insulation breakdown like that in a conventional semiconductor device does not occur before the drift region is completely depleted when the semiconductor device has been turned off. As a result, the semiconductor device set forth in the present specification is capable of reducing on-resistance while maintaining a high withstand voltage.

In the semiconductor device disclosed in the present specification, the insulating gate part may be disposed continually from the surface of the contact region to a portion of the surface of the channel region. The contact region and the gate electrode are thereby more reliably insulated by the gate insulating layer.

In the semiconductor device disclosed in the present specification, the Schottky gate part may be disposed continually from the surface of the drift region to a portion of the surface of the channel region. It is thereby more difficult for insulation breakdown of the gate insulating layer to occur when the semiconductor device is turned off.

The semiconductor device disclosed in the present specification may be a vertical or a lateral (horizontal) type. In the case of a vertical semiconductor device, a p-type semiconductor layer may be present at inner part of a semiconductor substrate. Further, a drift region may be formed to at least the same depth as the p-type semiconductor layer. A contact region may be in either a source region or a drain region. Further, the contact region may be in either an emitter region or a collector region. In the case of the vertical semiconductor device, the source region may be formed in a surface layer of the semiconductor substrate. In the case of a horizontal semiconductor device, the source region and the drain region may be formed in the surface layer of the semiconductor substrate. The technique set forth in the present specification has technical advantage if it is utilized between the contact region (the source region or the drain region), the channel region, and the drift region. Other configurations may take a variety of forms.

A source electrode may be disposed on a surface of a source region (i.e. a contact region). The source electrode may be separated from a gate electrode by an interlayer insulating layer. A gate insulating layer may be interposed between the interlayer insulating layer and a semiconductor substrate.

A main composition of an aperture region may be a group III nitride semiconductor (gallium nitride). A main composition of the gate electrode may be at least one of metal element selected from nickel, platinum, and gold. The gate insulating layer may be formed from a non-plasma layer.

In the embodiments described below, the same two lower digits are applied to elements having substantially the same configuration, and a duplicating description thereof may be omitted.

First Embodiment

Figure 1:
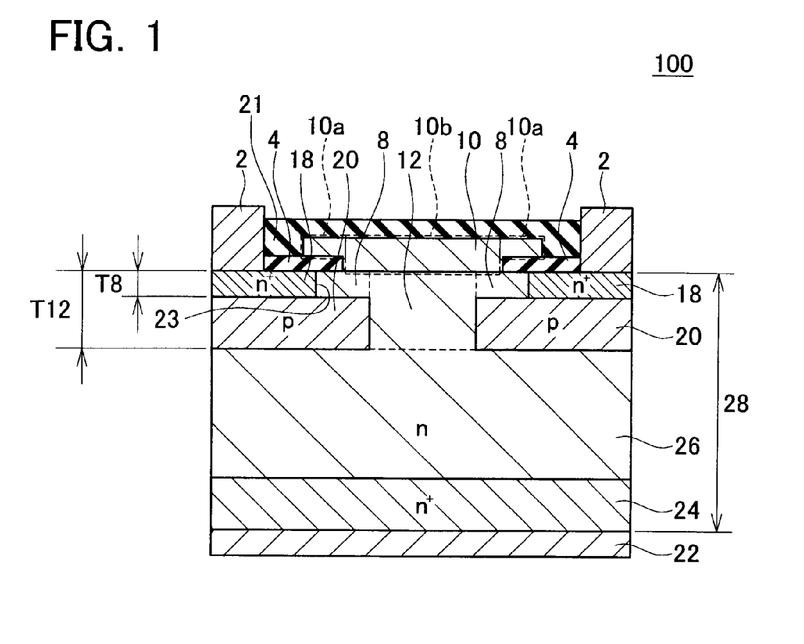
FIG. 1 shows a longitudinal cross-sectional view of a semiconductor device of a first embodiment.

A semiconductor device of a first embodiment will be described. FIG. 1 shows a cross-sectional view of essential parts of a vertical semiconductor device 100. The semiconductor device 100 is a vertical transistor having a pair of source electrodes 2 disposed on a surface of a semiconductor substrate 28, and a drain electrode 22 disposed on a rear surface of the semiconductor substrate 28. A gate electrode 10 is disposed between the pair of source electrodes 2 and the drain electrode 22. Actually, the gate electrode 10 is located between the drain electrode 22 and each of the source electrode 2. The gate electrode 10 switches the state of electric current between the drain electrode 22 and the pair of source electrodes 2 between a conducting state and a non-conducting state. Although this will be described later, the gate electrode 10 (which is an example of the gate structure) has an insulating gate part 10a and a Schottky gate part 10b. The semiconductor device 100 is utilized in, for example, an inverter circuit mounted on a vehicle. It is desirable for the semiconductor device 100 to have the characteristics of high withstand voltage and low on-resistance. Below, the features of the semiconductor device 100 will be described in detail from the rear surface side.

The drain electrode 22 is disposed on the rear surface of the semiconductor substrate 28. The material of the drain electrode 22 is titanium (Ti), aluminum (Al), nickel (Ni), and gold (Au), these being stacked in sequence. An n$^+$-type drain region 24 whose material is gallium nitride (GaN) is disposed on the drain electrode 22. An n-type drift region 26 whose material is gallium nitride is disposed on the drain region 24. A p-type embedded region 20 (which is an example of the p-type semiconductor region) whose material is also gallium nitride is disposed in a distributed manner on the drift region 26. Although this is not shown, the embedded region 20 is adjusted to have the same potential as the source electrode 2. Silicon (Si) is utilized as the impurities in the drain region 24. The impurities of the drain region 24 may alternatively be oxygen (O). The impurity concentration of the drain region 24 is adjusted to approximately $1\times10^{18}$ cm$^{-3}$. Silicon is utilized as the impurities of the drift region 26. The impurity concentration of the drift region 26 is adjusted to approximately $1\times10^{16}$ cm$^{-3}$. Magnesium (Mg) is utilized as the impurities of the embedded region 20. The impurity concentration of the embedded region 20 is adjusted to approximately $1\times10^{19}$ cm$^{-3}$.

An n$^+$-type source region 18 (an example of the contact region) made of gallium nitride, and an n-type channel region 8 also made of gallium nitride are disposed on a surface of the embedded region 20. The source region 18 and the channel region 8 are disposed at a portion of a surface layer of the semiconductor substrate 28, and are adjacent to one another. The impurity concentration of the source region 18 is adjusted to approximately $1\times10^{20}$ cm$^{-3}$, and the impurity concentration of the channel region 8 is adjusted to approximately $1\times10^{16}$ cm$^{-3}$. The impurity concentration of the source region 18 is greater than the impurity concentration of the channel region 8. Moreover, the thickness T8 (the first thickness) of the channel region 8 is approximately 0.5 μm.

An aperture region 12 made of gallium nitride is disposed above the drift region 26. The aperture region 12 is disposed on a portion of the surface layer of the semiconductor substrate 28, and makes contact with both the channel region 8 and the embedded region 20. The impurity concentration of the aperture region 12 is adjusted to approximately $1\times10^{16}$ cm$^{-3}$. The thickness T12 (the second thickness) of the aperture region 12 is approximately 1 μm, and is thicker than the thickness T8 of the channel region 8. The impurity concentration and the thickness T8 of the channel region 8 is adjusted such that the channel region 8 is configured to be completely depleted by the depletion layer extending from the embedded region 20.

As described above, the material of the drift region 26 and the aperture region 12 is gallium nitride, and the impurity concentration thereof is adjusted to be identical. The aperture region 12 is a passage along which electrons injected from the source region 18 flow in a vertical direction toward a rear surface of the semiconductor device 100. Further, the drift region 26 is also a passage along which electrons flow in a vertical direction. As a result, the aperture region 12 can be considered as a portion of the drift region 26. The aperture region 12 can also be referred to as a portion where a portion of the drift region 26 protrudes. As a result, the drift region can be referred to as making contact with both the channel region 8 and the embedded region 20. Moreover, the aperture region 12 is positioned between the pair of embedded regions 20. In other words, the aperture region 12 separates the pair of embedded regions 20.

The pair of source electrodes 2, the gate electrode 10, and a gate insulating layer 4 are disposed on the surface of the semiconductor substrate 28. Each of the source electrodes 2 is electrically connected to each of the source regions 18. The gate electrode 10 opposes a portion of a surface of each source region 18, an entire surface of the channel region 8, and an entire surface of the aperture region 12. The gate electrode 10 has the insulating gate part 10a and the Schottky gate part 10b. In the insulating gate part 10a, the gate electrode 10 opposes the portion of the source region 18 and a portion of the channel region 8 via the gate insulating layer 4. In other words, as shown in FIG. 1, the insulating gate part 10a extends laterally from above the surface of the portion of the source region 18, across a junction surface 23 between the source region 18 and the channel region 8, to above the portion of the surface of the channel region 8. In the Schottky gate part 10b, the gate electrode 10 makes direct contact with the aperture region 12 and a portion of the channel region 8. That is, the Schottky gate part 10b extends laterally above the entire surface of the aperture region 12 and also extending over the portion of the surface of the channel region 8. The material of the gate electrode 10 is nickel. Since nickel has a large work function, it provides Schottky characteristics with respect to gallium nitride. Gold, platinum (Pt), etc. may be adopted as the material of the gate electrode 10 instead of nickel.

The material of the gate insulating layer 4 is silicon oxide ($SiO_2$), and its thickness is approximately 0.1 μm. Further, the gate insulating layer 4 is a non-plasma layer. The source electrode 2 and the gate electrode 10 are electrically separated by an interlayer insulating layer 21. The interlayer insulating layer 21 is a plasma layer. The "non-plasma layer" referred to in the present specification means an insulating layer manufactured using a manufacturing method that does not utilize plasma (for example, the thermal CVD method). The "plasma layer" refers to an insulating layer manufactured using a manufacturing method that utilizes plasma (for example, the plasma CVD method).

One end of the gate insulating layer 4 makes contact with the gate electrode 10, and the other end makes contact with the source electrode 2. The gate insulating layer 4 is interposed between the interlayer insulating layer 21 and the semiconductor substrate 28, and prevents the interlayer insulating layer 21 and the semiconductor substrate 28 from making direct contact. The semiconductor device 100 is switched on and off by the embedded region 20, the source region 18, the channel region 8, the aperture region 12, and the gate electrode 10.

The operation of the semiconductor device 100 will now be described. When positive voltage is not being applied to the gate electrode 10, a depletion layer extends from the embedded region 20 toward the channel region 8. As a result, electrons of the source region 18 cannot pass through the channel region 8 and thus cannot reach the aperture region 12. Therefore, when positive voltage is not being applied to the gate electrode 10, the semiconductor device 100 is off. The semiconductor device 100 is a normally off type semiconductor device.

When positive voltage is applied to the gate electrode 10, a depletion layer formed in the channel region 8 contracts, and electrons are enhanced to form an electron channel between the source region 18 and the aperture region 12. Since the electrons can pass through the channel region 8, the electrons from the source region 18 reach the aperture region 12. Therefore, the semiconductor device 100 is turned on. In the semiconductor device 100, the electron channel can be formed in the channel region 8 by applying a 20V voltage to the gate electrode 10. In the semiconductor device 100, the gate electrode 10 covers not only the surface of the channel region 8, but also a portion of the source region 18 and the surface of the aperture region 12. As a result, the gate electrode 10 can reliably be configured to oppose the entire area of the channel region 8 even if a misalignment occurs in the position in which the gate electrode 10 is formed during the manufacture of the semiconductor device 100. In other words, from a plan view of the semiconductor device 100, a space is not formed between the gate electrode 10 and the source region 18. Since the electron channel is formed reliably in the entire area of the channel region 8, an increase in the resistance of the channel region 8 (i.e. channel resistance) can be suppressed. In the semiconductor device 100, the semiconductor device 100 can be switched on and off by changing the voltage applied to the gate electrode 10. That is, the conducting state and non-conducting state of the source electrode 2 and the drain electrode 22 are switched by changing the width of the depletion layer formed in the channel region 8.

When the semiconductor device 100 is switched from on to off, a potential difference occurs between the source electrode 2 and the drain electrode 22. Thereupon, the depletion layer extends from the embedded region 20 toward the channel region 8. At this occasion, the depletion layer extends not only toward the channel region 8, but also toward the aperture region 12. If the aperture region 12 is completely depleted, a high electric field is not applied to the gate electrode 10. In the meantime while the process of depletion, the high electric field may be applied to the Schottky gate part 10b of the gate electrode 10 during the transition period for the depletion layer to extend from the embedded region 20 to the aperture region 12. However, since the insulating layer is not interposed between the gate electrode 10 and the semiconductor substrate 28 in the Schottky gate part 10b, the Schottky gate part 10b is not destroyed even if the aforesaid high electric field is applied. At the least, the Schottky gate part 10b is capable of enduring a higher electric field than the insulating gate part 10a. As a result, the semiconductor device 100 is capable of obtaining a higher withstand voltage than the conventional semiconductor device 400 (see FIG. 10).

In the semiconductor device 400 of FIG. 10, for example, in the case where the thickness of the gate insulating layer 404 is 0.1 μm, the maximum permissible voltage that can be applied to the gate insulating layer 404 is approximately 30V. By contrast, in the semiconductor device 100, the gate electrode 10 is not destroyed even if voltage of approximately 600V is applied to the gate electrode 10. Moreover, the insulating gate part 10a is not disposed on the surface of the aperture region 12. As a result, a high electric field is not applied to the gate insulating layer 4. Further, since the depletion layer extends from the embedded region 20 to the aperture region 12, current does not flow between the gate electrode 10 and the drain electrode 22.

Figure 2:
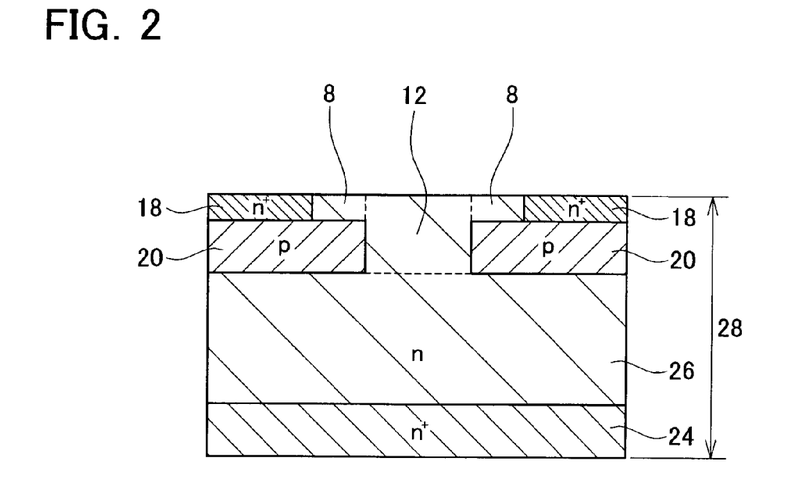
FIGS. 2-7 show manufacturing steps of the semiconductor device of the first embodiment.
Figure 3:
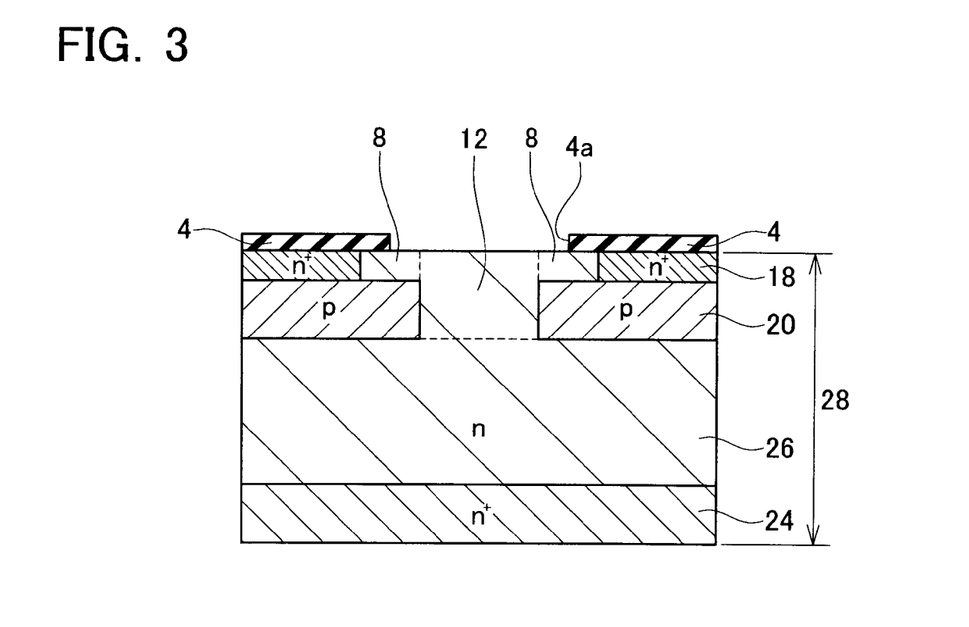
Figure 4:
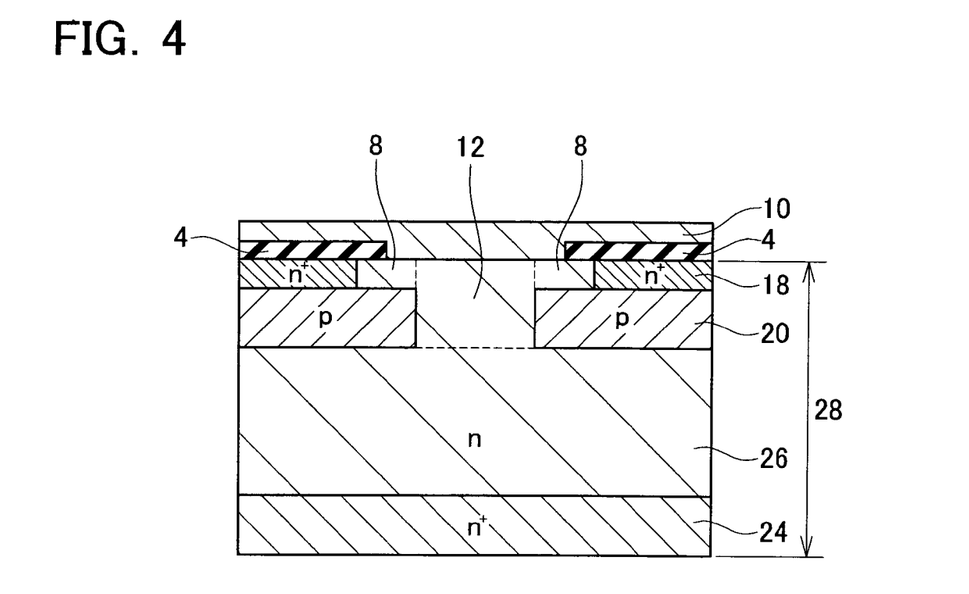
Figure 5:
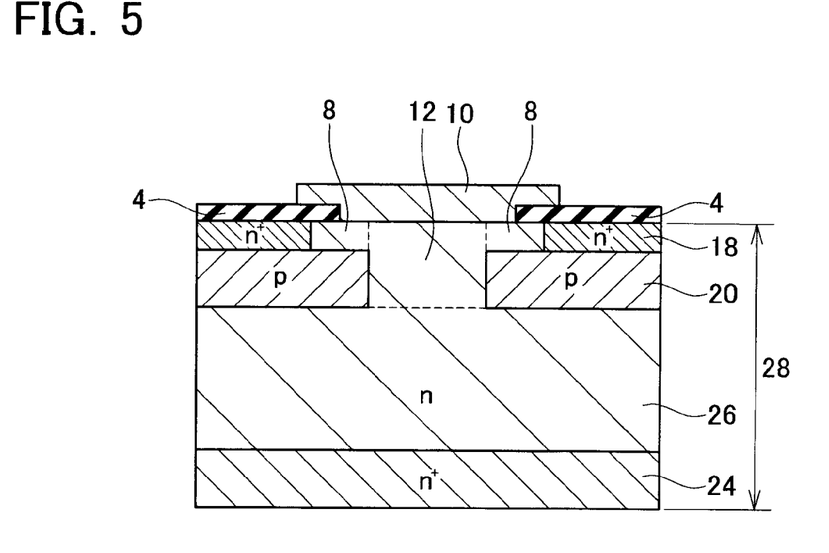

The manufacturing method of the semiconductor device 100 will now be described. First, as shown in FIG. 2, the semiconductor substrate 28 is completed. Since the semiconductor substrate 28 can be manufactured by using a known method, a description thereof will be omitted. Next, as shown in FIG. 3, the gate insulating layer 4 that has an opening 4a is formed on the surface of the semiconductor substrate 28. The gate insulating layer 4 can be formed by the thermal CVD method. As a result, the surface of the semiconductor substrate 28 is not covered by a plasma layer when the gate insulating layer 4 is formed. Next, as shown in FIG. 4, the gate electrode 10 is deposited on the exposing surface of the semiconductor substrate 28 and the surface of the gate insulating layer 4 utilizing the sputtering method. Then, as shown in FIG. 5, a predetermined portion of the gate electrode 10 is etched. At this step, the etching of the gate electrode 10 is carried out, however, the gate insulating layer 4 is not etched succeedingly. With only the portion of the gate electrode 10 being removed, the surface of a portion of the gate insulating layer 4 is again exposed.

Figure 6:
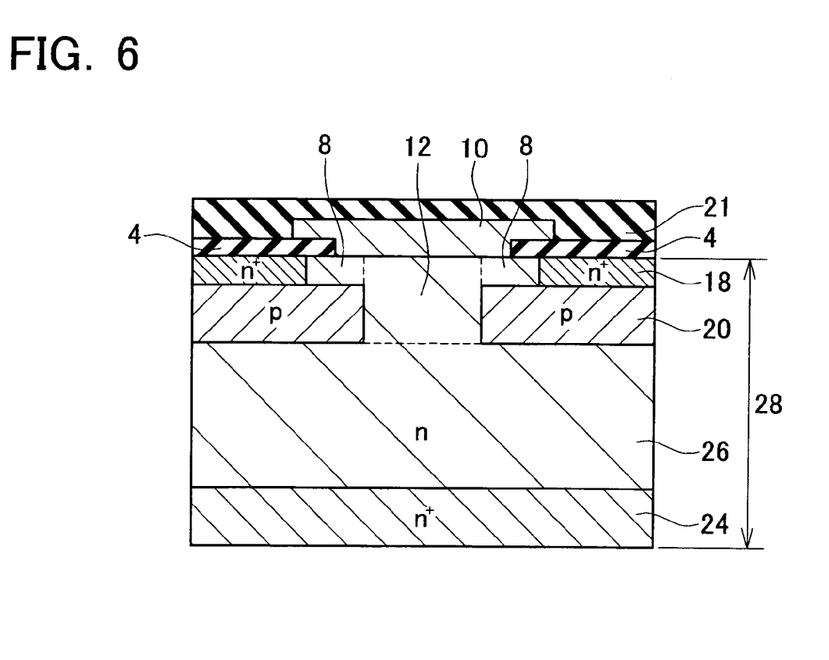
Figure 7:
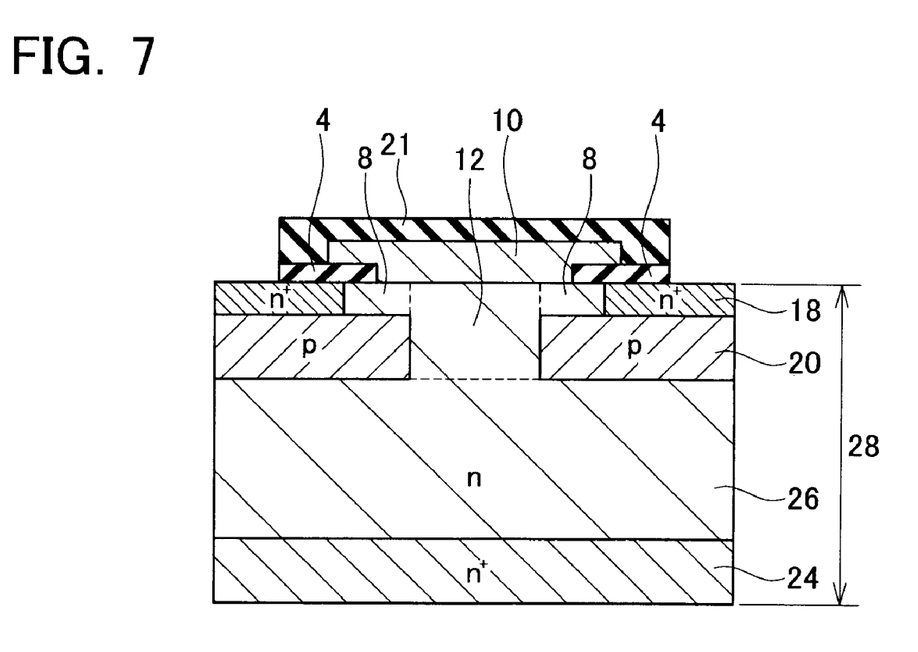

Next, as shown in FIG. 6, the interlayer insulating layer 21 is formed on the gate insulating layer 4 and the surface of the gate electrode 10. The interlayer insulating layer 21 can be formed by the plasma CVD method. The interlayer insulating layer 21 can be formed at a low temperature by utilizing the plasma CVD method. Moreover, since the gate insulating layer 4 is interposed, the interlayer insulating layer 21 does not make direct contact with the surface of the semiconductor substrate 28. Next, as shown in FIG. 7, predetermined portions of the interlayer insulating layer 21 and the gate insulating layer 4 are etched. Then, the source electrode 2 is formed on the exposed surface of the source region 18, and the drain electrode 22 is formed on the rear surface of the drain region 24, thereby completing the semiconductor device 100 of FIG. 1.

As described above, in the semiconductor device 100, the thermal CVD method is utilized when the gate insulating layer 4 is formed (FIG. 3). Thereupon, the plasma CVD method is utilized when the interlayer insulating layer 21 is formed (FIG. 6). In considering the advantages of being able to form the insulating layers at a low temperature, it is better to form both insulating layers utilizing the plasma CVD method. However, it is more difficult to apply voltage to the semiconductor regions when a plasma layer is utilized rather than a non-plasma layer. In addition to such issue, the plasma of the plasma layer may damage the channel region 8. As a result, when the plasma layer makes contact with the semiconductor regions 18, 8, and 12, the on-resistance of the semiconductor device 100 increases. In the semiconductor device 100, since the gate insulating layer 4 can be formed by a manufacturing method (the thermal CVD method) that does not utilize plasma, it is possible to prevent the on-resistance from increasing due to such causes. Further, in the semiconductor device 100, the gate insulating layer 4 is etched such that it remains when the gate electrode 10 is etched (FIG. 5). As a result, the interlayer insulating layer 21 that is formed utilizing the plasma CVD method does not make contact with the surface of the semiconductor substrate 28. Since the interlayer insulating layer 21 does not make contact with the semiconductor regions 18, 8, and 12, it is possible to prevent the on-resistance of the semiconductor device 100 from increasing.

Second Embodiment

Figure 8:
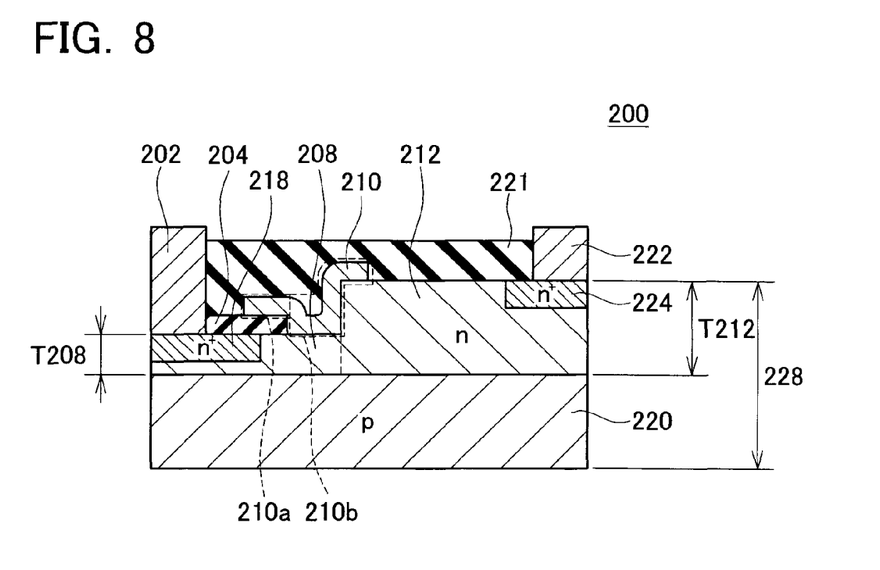
FIG. 8 shows a longitudinal cross-sectional view of a semiconductor device of a second embodiment.

A semiconductor device of a second embodiment will now be described. FIG. 8 shows a cross-sectional view of essential parts of a semiconductor device 200. The semiconductor device 200 is a variant of the semiconductor device 100. The semiconductor device 200 is a lateral type transistor. A channel region 208 and a drift region 212 are disposed on a surface of a p-type semiconductor region 220. Thickness T208 of the channel region 208 is thinner than thickness T212 of the drift region 212. As a result, when voltage is not being applied to a gate electrode 210, the channel region 208 is depleted by a depletion layer extending from the p-type semiconductor region 220. As a result, electrons cannot move from a source region 218 to the drift region 212.

As in the case of the semiconductor device 100, in the semiconductor device 200, the gate electrode 210 has an insulating gate part 210a and a Schottky gate part 210b. The insulating gate part 210a is disposed on a portion of a surface of the source region 218 and on a surface of the channel region 208. However, the insulating gate part 210a is not disposed on a surface of the drift region 212. The Schottky gate part 210b is disposed on the surface of the drift region 212. As a result, when the semiconductor device is turned off, damage to a gate insulating layer 204 can be prevented even if a high electric field is applied to the drift region 212. Moreover, in the semiconductor device 200, a portion of an interlayer insulating layer 221 makes contact with a portion of the drift region 212. Current is not switched between a conducting state and a non-conducting state in the range of the drift region 212 that makes contact with the interlayer insulating layer 221. As a result, the on-resistance of the semiconductor device 200 does not increase even though a portion of the interlayer insulating layer 221 makes contact with a portion of the drift region 212.

Third Embodiment

Figure 9:
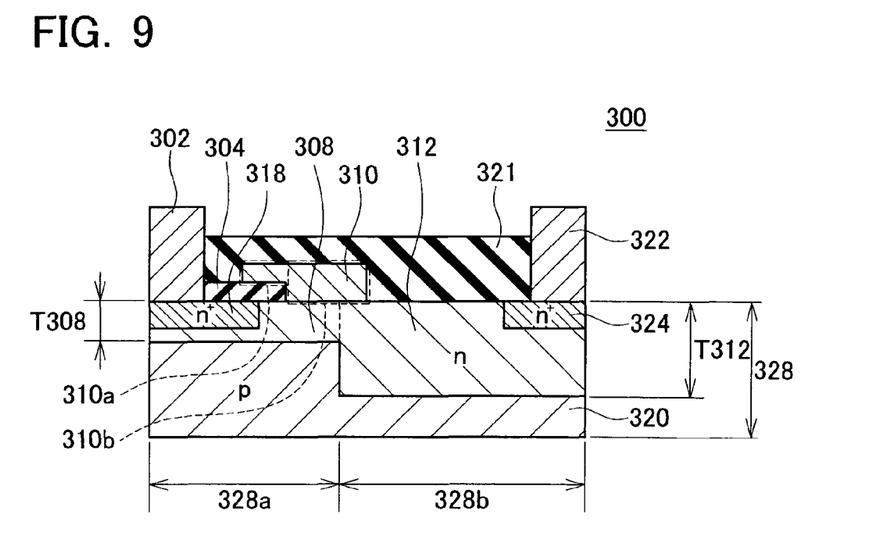
FIG. 9 shows a longitudinal cross-sectional view of a semiconductor device of a third embodiment.

A semiconductor device of a third embodiment will now be described. FIG. 9 shows a cross-sectional view of essential parts of a semiconductor device 300. The semiconductor device 300 is a variant of the semiconductor device 200. The semiconductor device 300 is also a lateral type transistor. Different from the semiconductor device 200, in the semiconductor device 300, thickness of a semiconductor substrate 328 is uniform. Furthermore, in the semiconductor device 300, thickness of a p-type semiconductor region 320 varies. The p-type semiconductor region 320 is thick in a range 328a, and is thin in a range 328b. As a result, thickness T312 of a drift region 312 is thicker than thickness T308 of a channel region 308. Since the thickness of the p-type semiconductor region 320 is varied in the semiconductor device 300, the thickness T312 of the drift region 312 can be made thicker than the thickness T308 of the channel region 308, while the thickness of the semiconductor substrate 328 remains uniform.

Specific embodiments of the present teachings are described above, but these merely illustrate some possibilities of the teachings and do not restrict the scope of the claims. The art set forth in the claims includes variations and modifications of the specific examples set forth above. The technical elements disclosed in the present specification or the drawings may be utilized separately or in all types of combinations, and are not limited to the combinations set forth in the claims at the time of filing of the application. Furthermore, the technology illustrated in the present specification or the drawings may simultaneously achieve a plurality of objects, and has technological utility by achieving one of those objects.

What is claimed is:
1. A semiconductor device comprising:
a semiconductor substrate having a surface layer and a p-type semiconductor region, wherein the surface layer includes a contact region, a channel region and a drift region, the channel region is adjacent to and in contact with the contact region, the drift region is adjacent to and in contact with the channel region and includes n-type impurities at least in part, and the p-type semiconductor region is in contact with the drift region and at least a portion of a rear surface of the channel region;
a main electrode disposed on the surface layer and electrically connected to the contact region;

a gate electrode disposed on the surface layer and extending from above a portion of the contact region to above at least a portion of the drift region via above the channel region, and an insulating layer covering at least the portion of the contact region and not covering at least the portion of the drift region, wherein the gate electrode and the contact region are insulated by the insulating layer, and the gate electrode and the drift region are in direct contact to form a Schottky junction.

2. A semiconductor device as in claim 1,
wherein the insulating layer covers a portion of the channel region and an entire area where the contact region and the gate electrode oppose.

3. A semiconductor device as in claim 1,
wherein the insulating layer does not cover a portion of the channel region and an entire area where the drift region and the gate electrode oppose.

4. A semiconductor device as in claim 1, wherein
the channel region comprises a first thickness in a vertical direction with respect to the surface of the semiconductor substrate,
the drift region comprises a second thickness in the vertical direction, and
the first thickness is smaller than the second thickness.

5. A semiconductor device as in claim 1, wherein
the insulating layer is a non-plasma layer.

6. A method of manufacturing a semiconductor device of claim 1, the method comprising:
preparing a semiconductor substrate having a surface layer and a p-type semiconductor region, wherein the surface layer includes a contact region, a channel region adjacent to and in contact with the contact region, and a drift region adjacent to and in contact with the channel region and including n-type impurities at least in part, and the p-type semiconductor region is in contact with the drift region and at least a portion of a rear surface of the channel region;
forming an insulating layer on the surface of the semiconductor substrate, the insulating layer comprising an opening from which at least a portion of the drift region exposes and covering the entirety of the contact region;
forming a gate electrode on the insulating layer and the opening, the gate electrode extending from above at least a portion of the contact region to above at least the portion of the drift region via above the channel region and being in contact with the portion of the drift region; and
forming a main electrode on the surface layer to make contact with the contact region.

7. A method of manufacturing a semiconductor device as in claim 6,
wherein the insulating layer is formed to further cover a portion of the channel region.

8. A method of manufacturing a semiconductor device as in claim 6, wherein
the channel region is formed to comprise a first thickness in a vertical direction with respect to the surface of the semiconductor substrate,
the drift region is formed to comprise a second thickness in the vertical direction, and
the first thickness is smaller than the second thickness.

9. A semiconductor device comprising:
a semiconductor substrate having a surface layer and a p-type semiconductor region arranged below the surface layer, wherein the surface layer includes a contact region, a channel region and a drift region;
a main electrode disposed on the surface layer and electrically connected to the contact region;
a gate electrode disposed on the surface layer, extending from above at least a portion of the contact region to above at least a portion of the drift region via above the channel region; and
an insulating layer disposed at least between the portion of the contact region and the gate electrode; wherein
the p-type semiconductor region makes contact with the drift region and at least a portion of a rear surface of the channel region,
the channel region is adjacent to and in contact with the contact region,
the drift region is adjacent to and in contact with the channel region, and includes n-type impurities at least in part, and
the gate electrode comprises an insulating gate electrode part in which the gate electrode opposes the portion of the contact region via the insulating layer and a Schottky electrode part in which the gate electrode makes direct contact with the drift region.

10. A semiconductor device as in claim 9, wherein
wherein the insulating layer covers a portion of the channel region and an entire area where the contact region and the gate electrode oppose each other.

11. A semiconductor device as in claim 9,
further comprising another main electrode,
wherein the gate electrode is arranged between the pair of main electrodes.

12. A semiconductor device as in claim 9, wherein
the channel region comprises a first thickness in a vertical direction with respect to the surface of the semiconductor substrate,
the drift region comprises a second thickness in the vertical direction, and
the first thickness is smaller than the second thickness.

13. A semiconductor device as in claim 9, wherein
the insulating layer is a non-plasma layer.

* * * * *